United States Patent
Nagao

(10) Patent No.: US 8,375,570 B2
(45) Date of Patent: *Feb. 19, 2013

(54) ELECTRONIC COMPONENT MOUNTING SYSTEM AND ELECTRONIC COMPONENT MOUNTING METHOD

(75) Inventor: Kazuhide Nagao, Yamanashi (JP)

(73) Assignee: Panasonic Corporation, Osaka (JP)

( * ) Notice: Subject to any disclaimer, the term of this patent is extended or adjusted under 35 U.S.C. 154(b) by 13 days.

This patent is subject to a terminal disclaimer.

(21) Appl. No.: 13/122,301

(22) PCT Filed: Sep. 29, 2009

(86) PCT No.: PCT/JP2009/005009
§ 371 (c)(1),
(2), (4) Date: Apr. 1, 2011

(87) PCT Pub. No.: WO2010/038437
PCT Pub. Date: Apr. 8, 2010

(65) Prior Publication Data
US 2011/0179638 A1    Jul. 28, 2011

(30) Foreign Application Priority Data
Oct. 3, 2008    (JP) ................ P2008-258139

(51) Int. Cl.
*B23P 19/00*    (2006.01)
(52) U.S. Cl. ............. 29/740; 29/739; 29/741; 29/743; 700/116
(58) Field of Classification Search ........... 29/739–742, 29/743, 833–834; 700/115–116, 121
See application file for complete search history.

(56) References Cited

U.S. PATENT DOCUMENTS
5,495,661 A * 3/1996 Gromer et al. .............. 29/740
(Continued)

FOREIGN PATENT DOCUMENTS
JP    H07-131186 A    5/1995
JP    08-032225 A    2/1996
(Continued)

OTHER PUBLICATIONS
International Search Report for PCT/JP2009/005009 dated Oct. 27, 2009.

*Primary Examiner* — Minh Trinh
(74) *Attorney, Agent, or Firm* — Pearne & Gordon LLP

(57) ABSTRACT

An object of the invention is to provide an electronic component mounting system and an electronic component mounting method which can execute component mounting work on a plurality of boards simultaneously, concurrently and efficiently so that high productivity and responsiveness to production of many items can be achieved consistently. Provided is an electronic component mounting line (1) which is formed so that a screen printing portion having a plurality of individual printing mechanisms capable of executing setup change works individually is connected to an upstream side of a component mounting portion having a plurality of board conveyance mechanisms, and which is configured so that either of a first work mode in which component mounting work is continuously executed on a fixed board type in all individual mounting lanes (L1 and L2) and a second work mode in which component mounting work is intermittently executed in one individual mounting lane while setup change work is repeated in corresponding one of the individual printing mechanisms whenever board types are changed from one to another in the individual mounting lane is selectively designated in multi-board mounting work in which the individual mounting lanes are operated to execute component mounting work on a plurality of boards simultaneously and concurrently.

4 Claims, 14 Drawing Sheets

U.S. PATENT DOCUMENTS

| | | | |
|---|---|---|---|
| 6,480,751 B1 * | 11/2002 | Kuribayashi et al. | 700/56 |
| 8,140,176 B2 * | 3/2012 | Sumi | 700/116 |
| 2002/0073537 A1 | 6/2002 | Sumi | |
| 2011/0023294 A1 * | 2/2011 | Awata et al. | 29/739 |
| 2011/0179638 A1 * | 7/2011 | Nagao | 29/729 |
| 2011/0197437 A1 * | 8/2011 | Nagao | 29/729 |

FOREIGN PATENT DOCUMENTS

| | | |
|---|---|---|
| JP | 2002-57492 A | 2/2002 |
| JP | 2003-204191 A | 7/2003 |
| JP | 3562450 B2 | 6/2004 |
| JP | 2005-081745 A | 3/2005 |
| JP | 2008-159855 A | 7/2008 |

* cited by examiner

ELECTRONIC COMPONENT MOUNTING SYSTEM AND ELECTRONIC COMPONENT MOUNTING METHOD

TECHNICAL FIELD

The present invention relates to an electronic component mounting system and an electronic component mounting method for mounting electronic components on boards to produce mounted boards.

BACKGROUND ART

An electronic component mounting system for mounting electronic components on boards to produce mounted boards has an electronic component mounting line which is configured so that a screen printing module for printing soldering paste on electronic components, an electronic component mounting module for mounting electronic components on boards after printing, etc. are connected (e.g. see Patent Document 1). A prior technique example described in this Patent Document has disclosed configuration in which a screen printing module, an electronic component mounting module and a reflow module are connected in series.

PRIOR TECHNICAL DOCUMENT

Patent Document

Patent Document 1: Japanese Patent No. 3562450

SUMMARY OF THE INVENTION

Problem that the Invention is to Solve

In the recent electronic industry, diversification in production form has advanced so that suitable change between conventional mass production of one and same items and small volume production of many items has become the mainstream. For example, in a mounting line for producing circuit boards for cell phones, etc., hot-selling popular models newly on sale need to be mass-produced in a short term in order to satisfy a temporarily increasing demand. On the contrary, models having excellent characteristic in functional and design aspects, etc. and firmly popular among a specific customer base need to be produced in small lots for a long term. Because such models often have a wide variety of products, small volume production of many items accompanied by frequent model change cannot but be used for these models.

In order to meet such diversification in demand, suitable use of either mass production of one and the same items or small volume production of many items is required in accordance with temporary demand forecasting and a situation of accepted orders on a production site. Specifically, a plurality of general-purpose electronic component mounting lines are provided, and board types to be produced are distributed to the respective mounting lines in accordance with a production plan which is always updated. However, conventional electronic component mounting equipment inclusive of the Patent Document example has not been configured to efficiently support the production form in which mass production of one and the same items and small volume production of many items are mixed, so that it is difficult for the conventional electronic component mounting equipment to achieve high productivity and responsiveness to production of many items consistently.

Therefore, an object of the invention is to provide an electronic component mounting system and an electronic component mounting method which can execute component mounting work on a plurality of boards simultaneously, concurrently and efficiently so that high productivity and responsiveness to production of many items can be achieved consistently.

Means for Solving the Problem

The electronic component mounting system according to the invention is an electronic component mounting system formed so that a screen printing portion for printing electronic component joint paste on boards is disposed on an upstream side of a component mounting portion for mounting electronic components on the boards, the electronic component mounting system including: individual printing mechanisms which are provided in the screen printing portion and controlled individually so that printing operations can be performed independently and setup change works due to change in print target board type can be executed individually; board conveyance mechanisms which are provided in the component mounting portion to convey the boards printed and conveyed out of the individual printing mechanisms respectively, and component mounting mechanisms which are provided in the component mounting portion to execute component mounting works on the boards conveyed by the board conveyance mechanisms respectively; a mode instruction portion which designates a work mode indicating a mode of component mounting work to be executed by each of individual mounting lanes in multi-board mounting work in which the individual mounting lanes each composed of a combination of corresponding one of the individual printing mechanisms, corresponding one of the board conveyance mechanisms and corresponding one of the component mounting mechanisms are operated to execute component mounting work on boards simultaneously and concurrently; and a control portion which controls the screen printing portion and the component mounting portion in accordance with the designated work mode; wherein: the mode instruction portion selectively designates either of a first work mode in which component mounting work is continuously executed on a single board type in each individual mounting lane, and a second work mode in which component mounting work is intermittently executed on a plurality of board types in one individual mounting lane while the setup change work is executed repeatedly in the individual printing mechanism of the individual mounting lane whenever the board types are changed from one to another in the individual mounting lane.

The electronic component mounting method according to the invention is an electronic component mounting method performed by an electronic component mounting system formed so that a screen printing portion for printing electronic component joint paste on boards is disposed on an upstream side of a component mounting portion for mounting electronic components on the boards, the electronic component mounting system including: individual printing mechanisms which are provided in the screen printing portion and controlled individually so that printing operations can be performed independently and setup change works due to change in print target board type can be executed individually; board conveyance mechanisms which are provided in the component mounting portion to convey the boards printed and conveyed out of the individual printing mechanisms respectively, and component mounting mechanisms which are provided in the component mounting portion to execute component mounting works on the boards conveyed by the board conveyance mechanisms respectively; a mode instruction portion which designates a work mode indicating a mode of component mounting work to be executed by each of individual mounting lanes in multi-board mounting work in which the individual mounting lanes each composed of a combination of corresponding one of the individual printing mechanisms, corresponding one of the board conveyance mechanisms and corresponding one of the component mounting mechanisms are operated to execute component mounting work on boards simultaneously and concurrently; and a control portion which controls the screen printing portion and the component mounting portion in accordance with the designated work mode; wherein: the mode instruction portion selectively designates either of a first work mode in which component mounting work is continuously executed on a single board type in each individual mounting lane, and a second work mode in which component mounting work is intermittently executed on a plurality of board types in one individual mounting lane while the setup change work is executed repeatedly in the individual printing mechanism of the individual mounting lane whenever the board types are changed from one to another in the individual mounting lane.

Effect of the Invention

According to the invention, provided is an electronic component mounting system which is formed so that a screen printing portion having a plurality of individual printing mechanisms is connected to an upstream side of a component mounting portion having a plurality of board conveyance mechanisms, and which is configured so that either of a first work mode in which component mounting work is continuously executed on a fixed board type in all individual mounting lanes and a second work mode in which component mounting work is intermittently executed in one individual mounting lane while setup change work is repeated in corresponding one of the individual printing mechanisms whenever board types are changed from one to another in the individual mounting lane is selectively designated in multi-board mounting work in which the individual mounting lanes are operated to execute component mounting work on a plurality of boards simultaneously and concurrently. In this manner, both mass production of one and the same items and small volume production of many items can be used suitably selectively by one electronic component mounting line, so that high productivity and responsiveness to production of many items can be achieved consistently.

MODE FOR CARRYING OUT THE INVENTION

Figure 1:
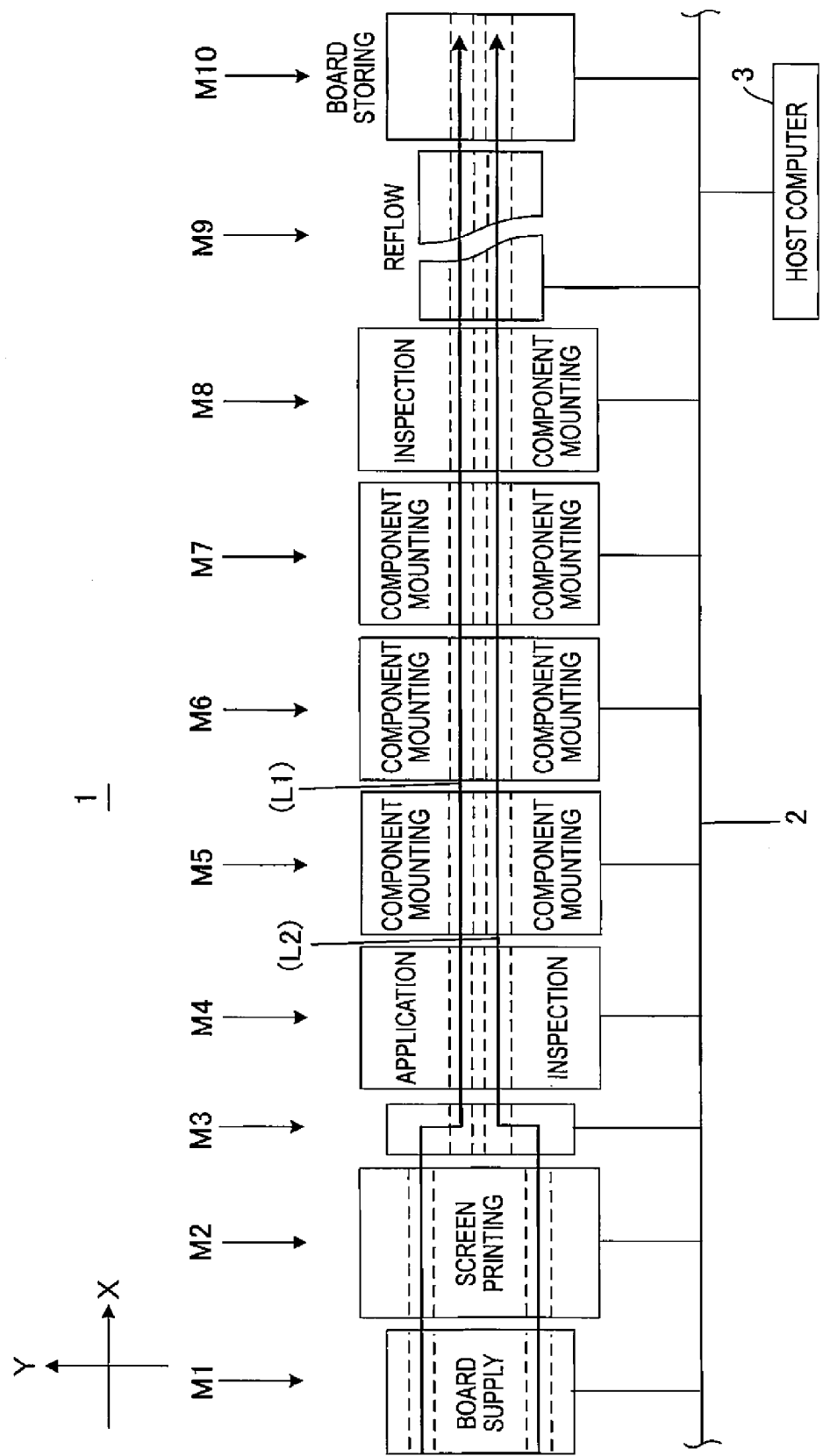
FIG. 1 is a diagram for explaining the configuration of an electronic component mounting system according to an embodiment of the invention.
Figure 2:
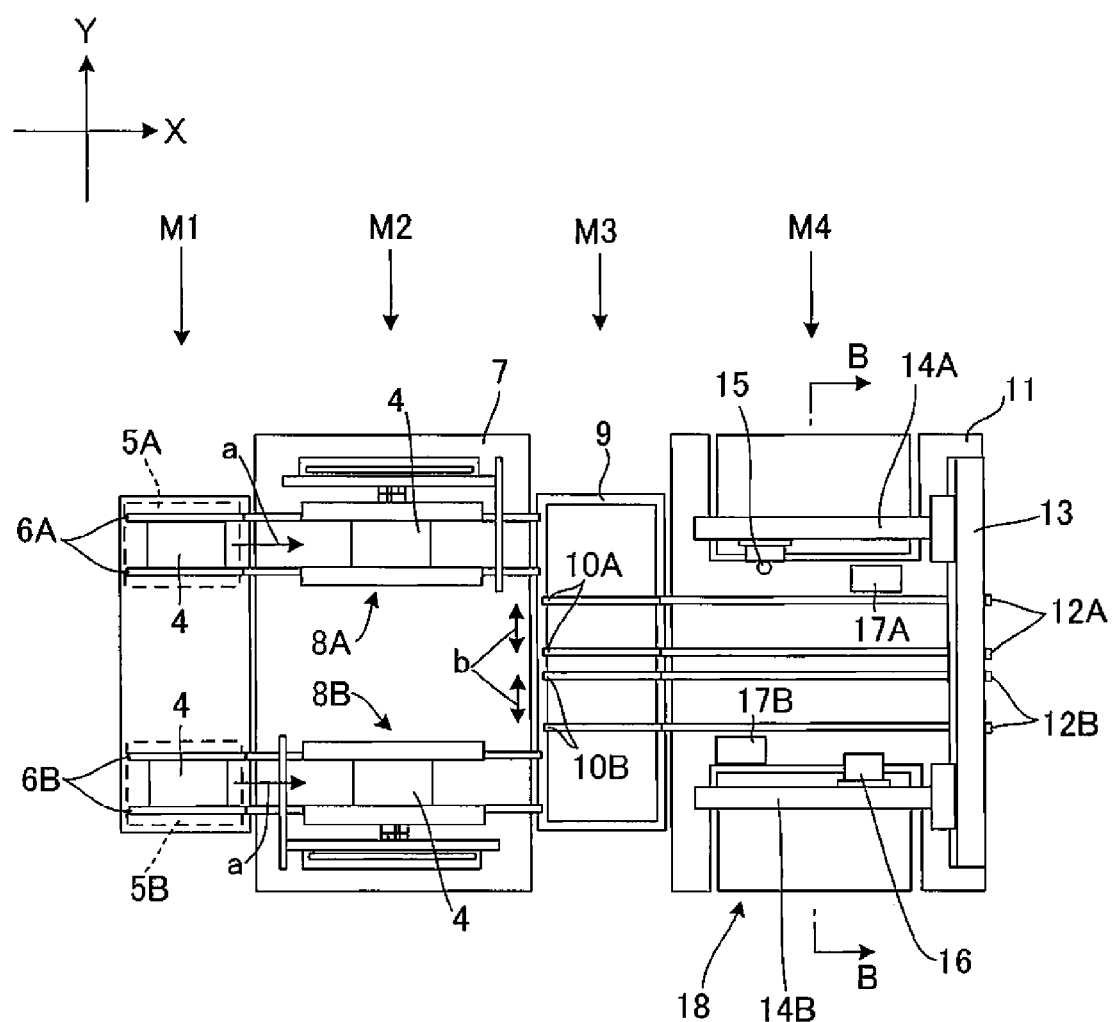
FIG. 2 is a plan view showing part of the electronic component mounting system according to an embodiment of the invention.
Figure 3:
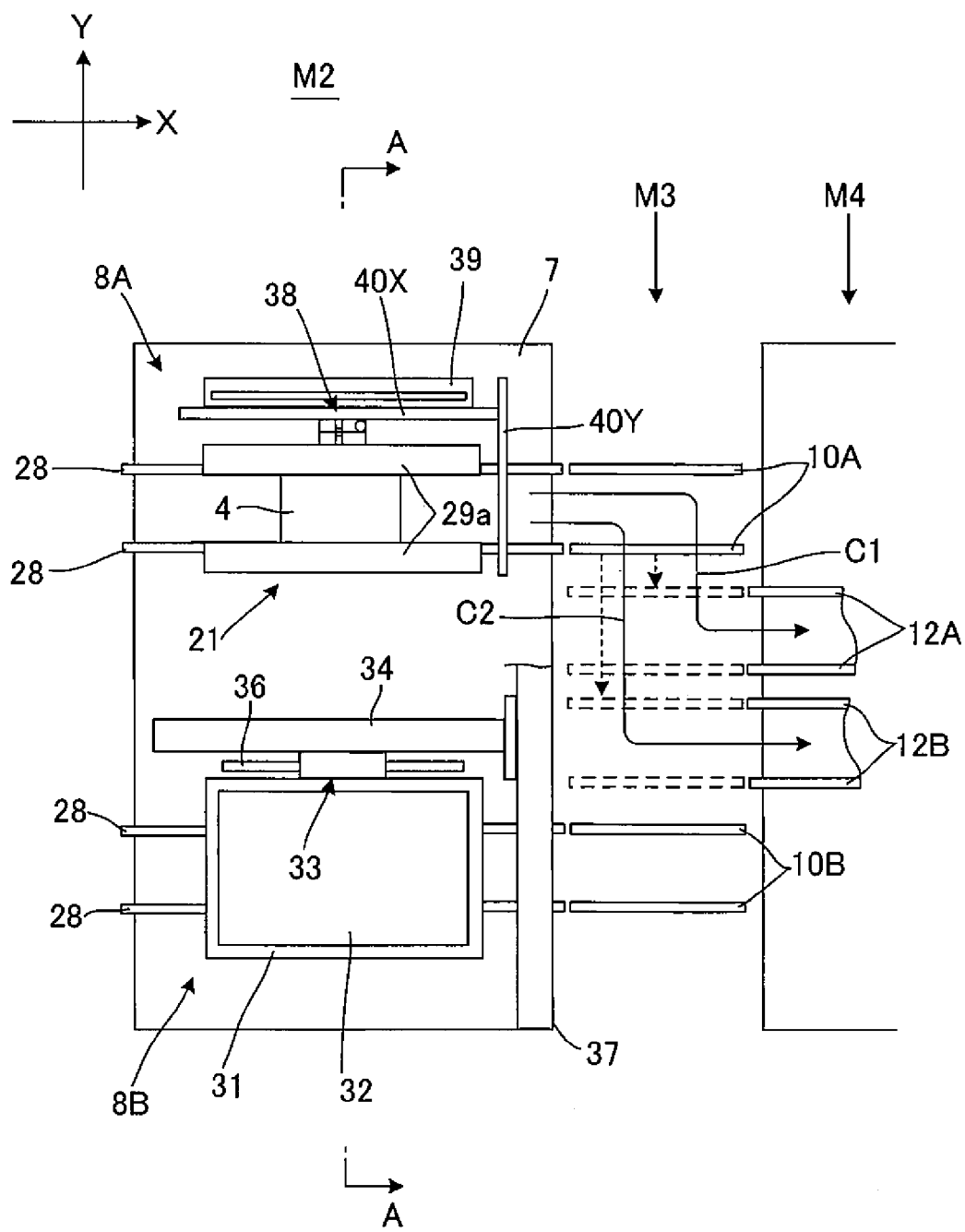
FIG. 3 is a plan view of a screen printing module in the electronic component mounting system according to an embodiment of the invention.
Figure 4:
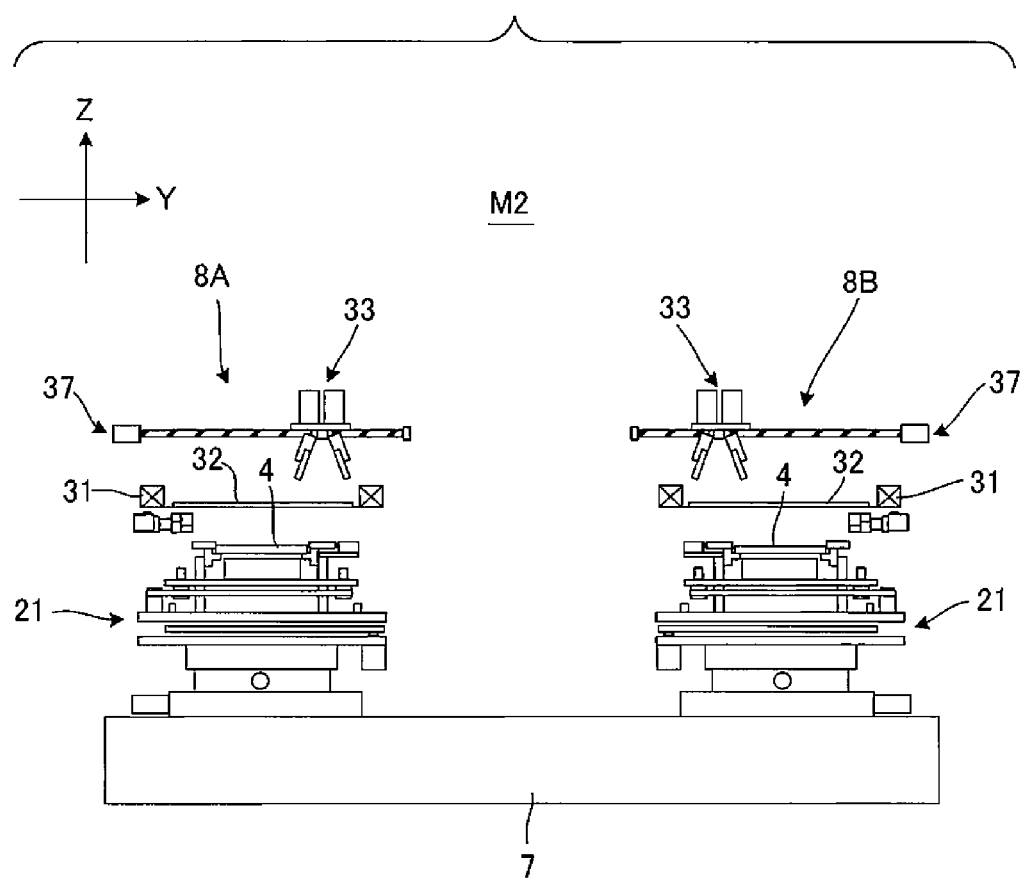
FIG. 4 is a sectional view of the screen printing module in the electronic component mounting system according to an embodiment of the invention.
Figure 5:
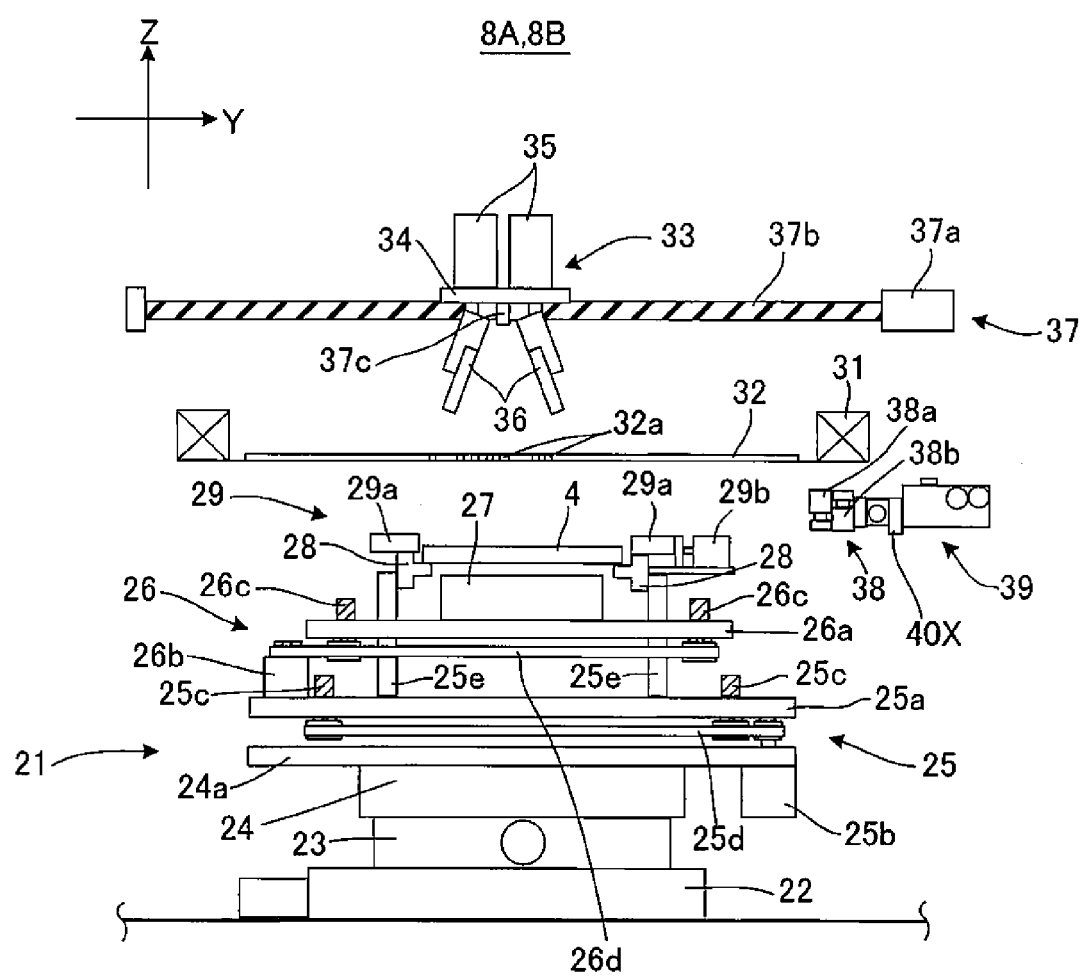
FIG. 5 is a sectional view of the screen printing module in the electronic component mounting system according to an embodiment of the invention.
Figure 6:
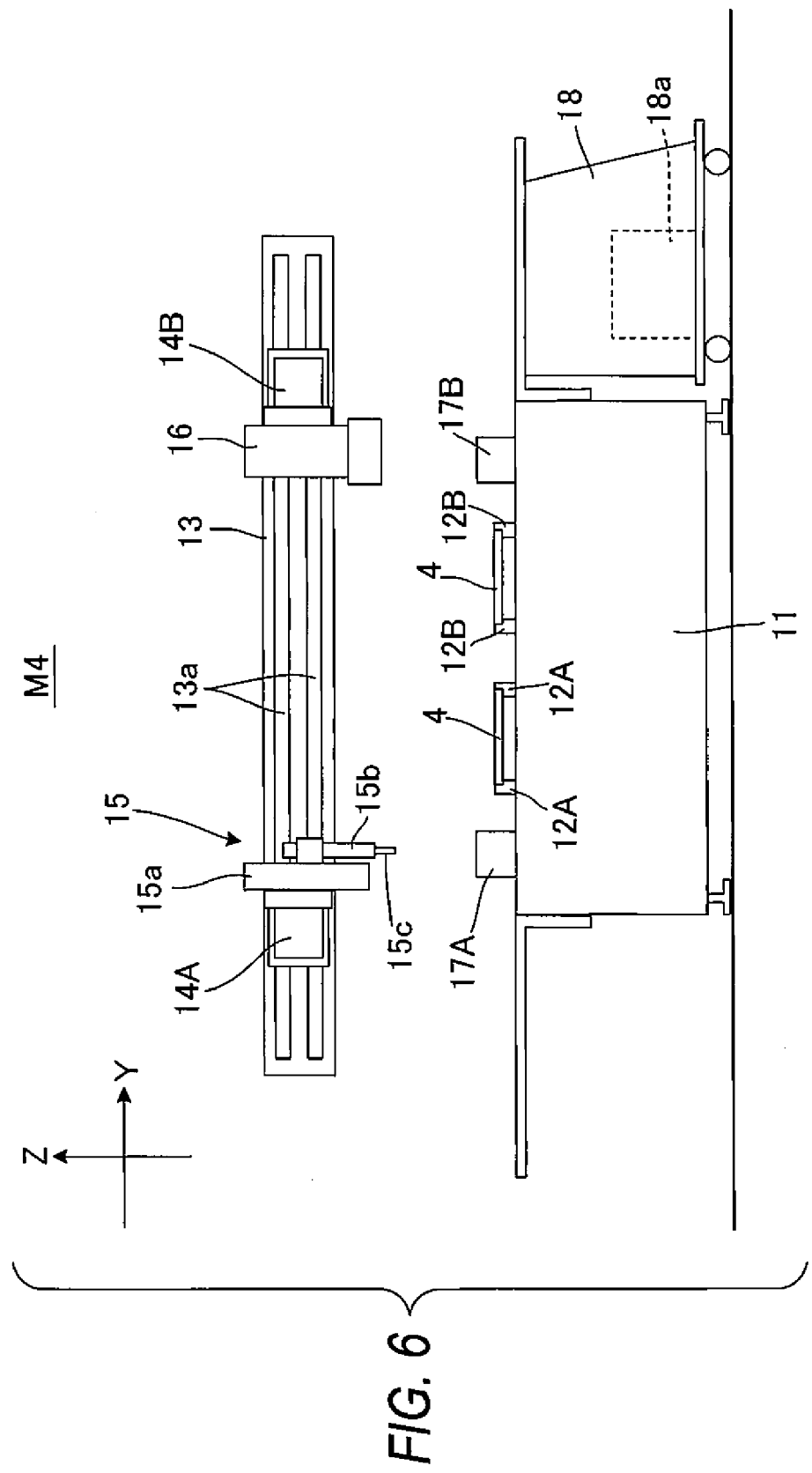
FIG. 6 is a sectional view of an application/inspection module in the electronic component mounting system according to an embodiment of the invention.
Figure 7:
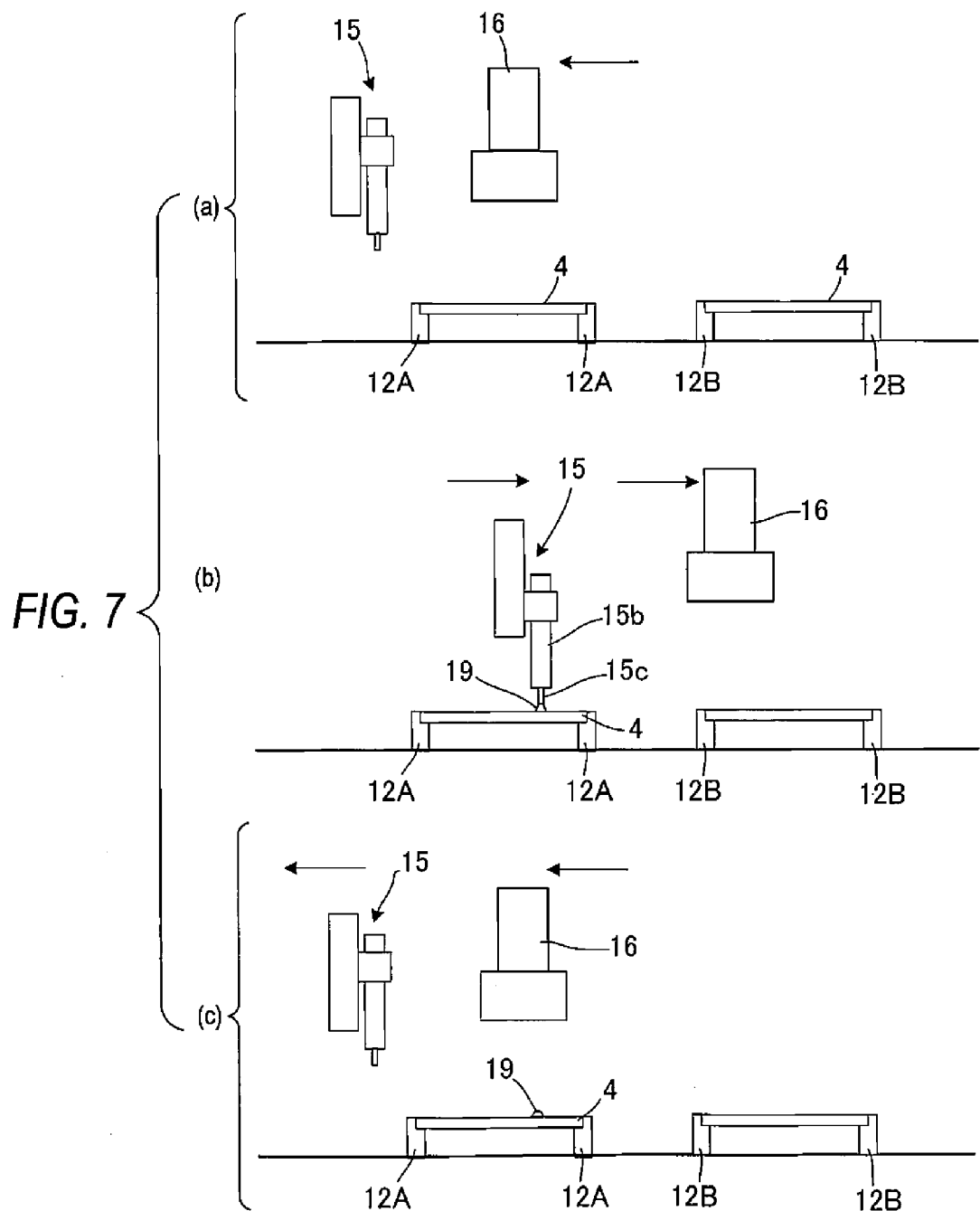
FIGS. 7 (*a*) to (*c*) are views for explaining operation of the application/inspection module in the electronic component mounting system according to an embodiment of the invention.
Figure 8:
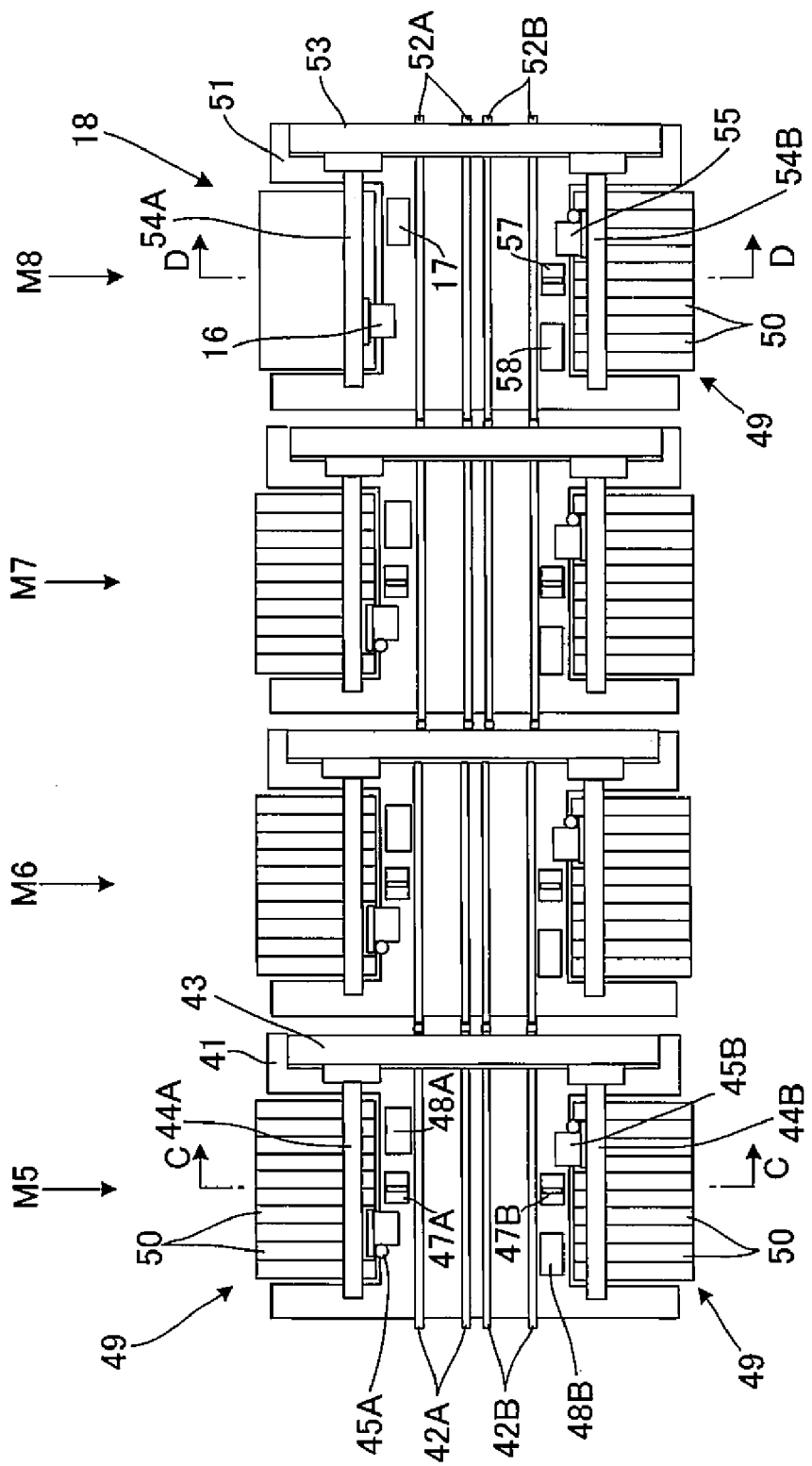
FIG. 8 is a plan view showing part of the electronic component mounting system according to an embodiment of the invention.
Figure 9:
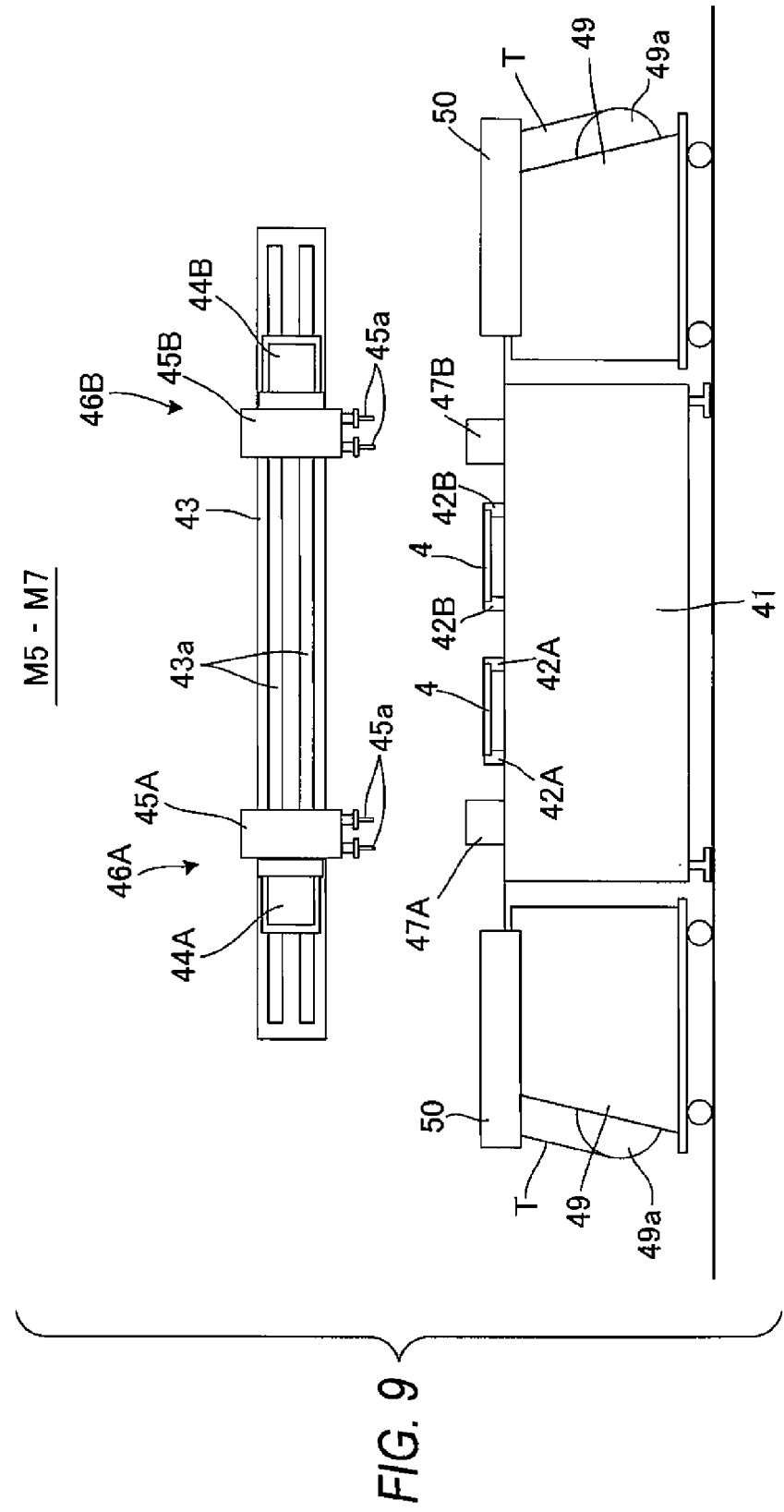
FIG. 9 is a sectional view of an electronic component mounting module in the electronic component mounting system according to an embodiment of the invention.
Figure 10:
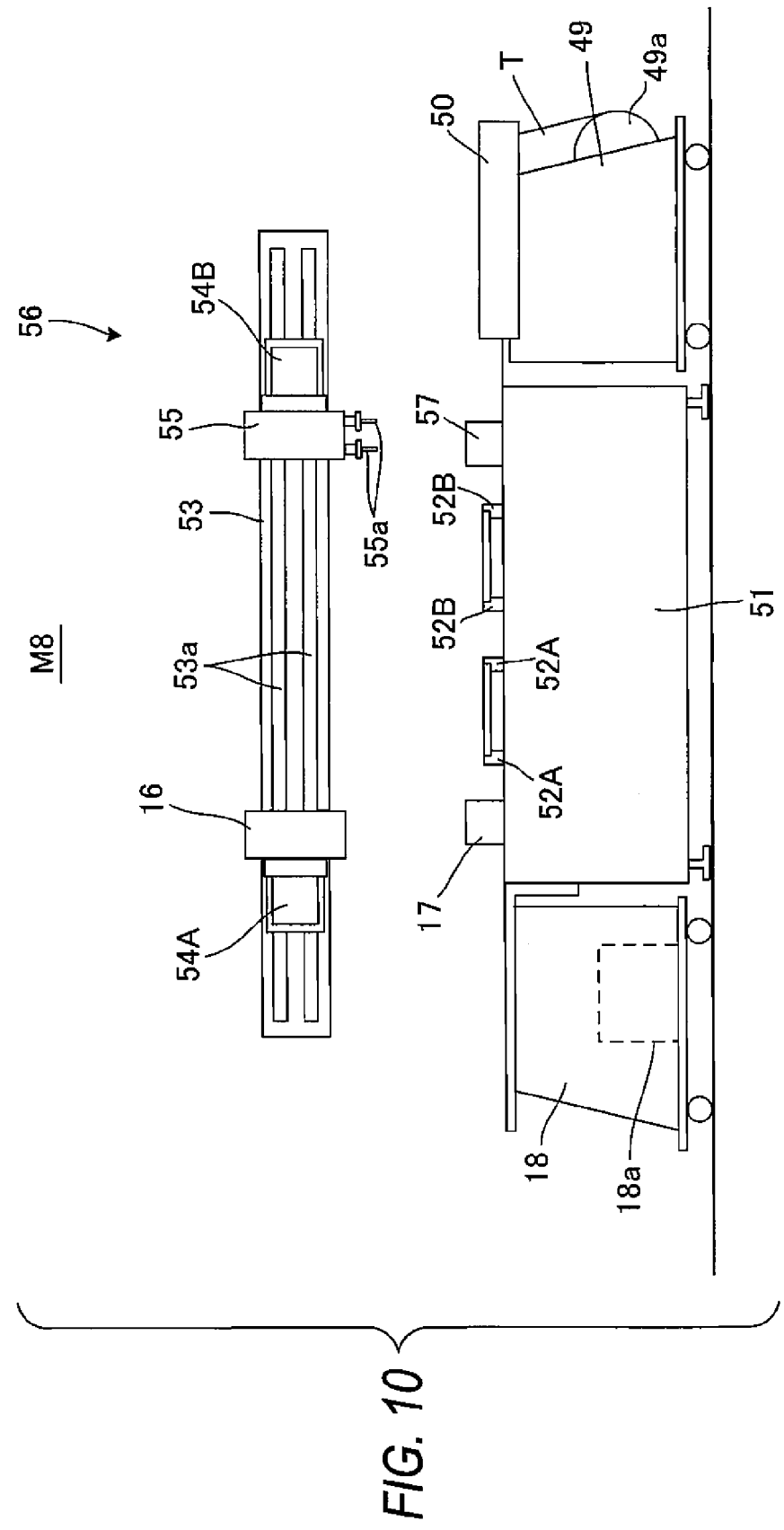
FIG. 10 is a sectional view of a mounting/inspection module in the electronic component mounting system according to an embodiment of the invention.
Figure 11:
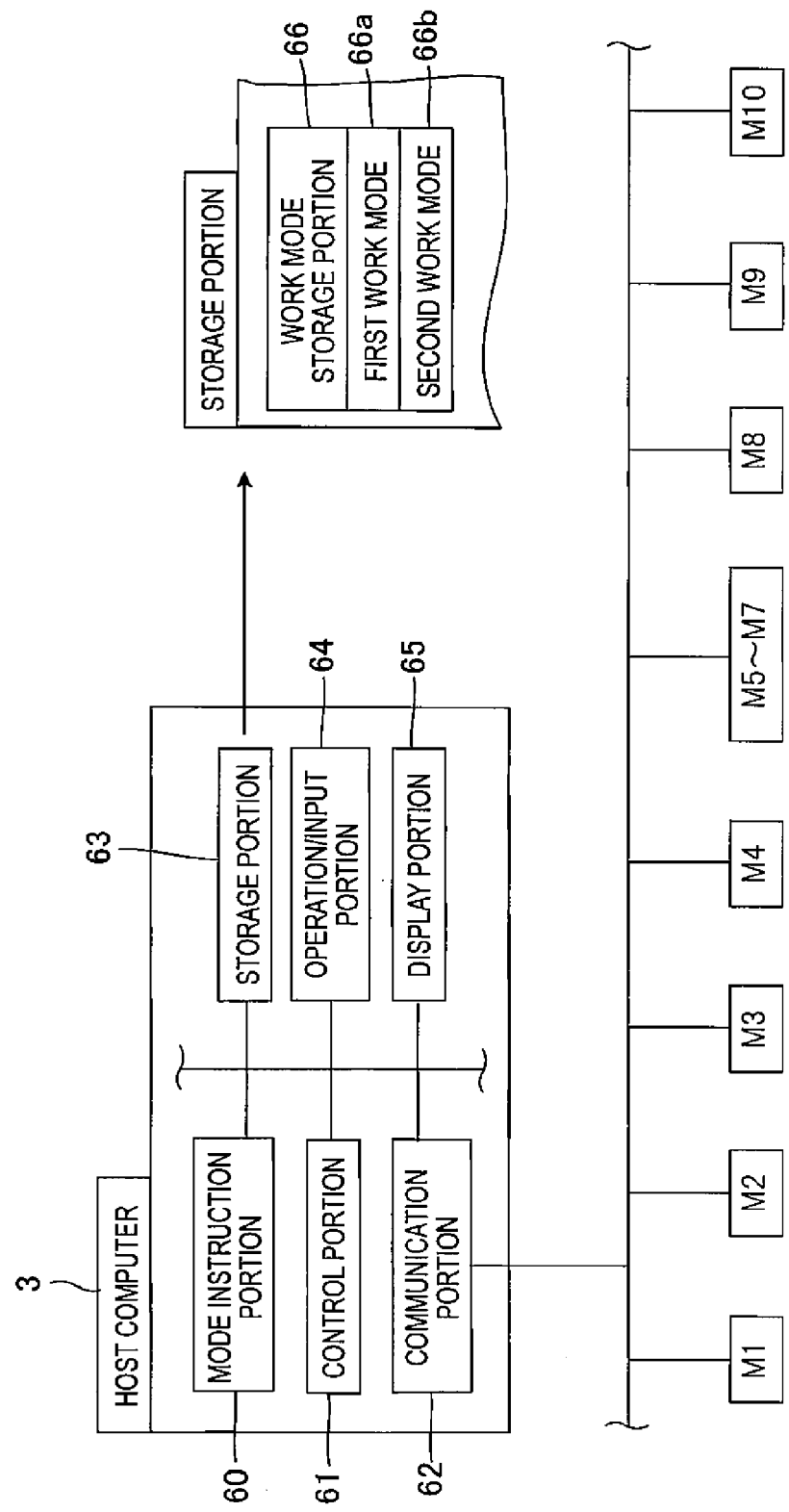
FIG. 11 is a block diagram showing the configuration of a control system for the electronic component mounting system according to an embodiment of the invention.
Figure 12:
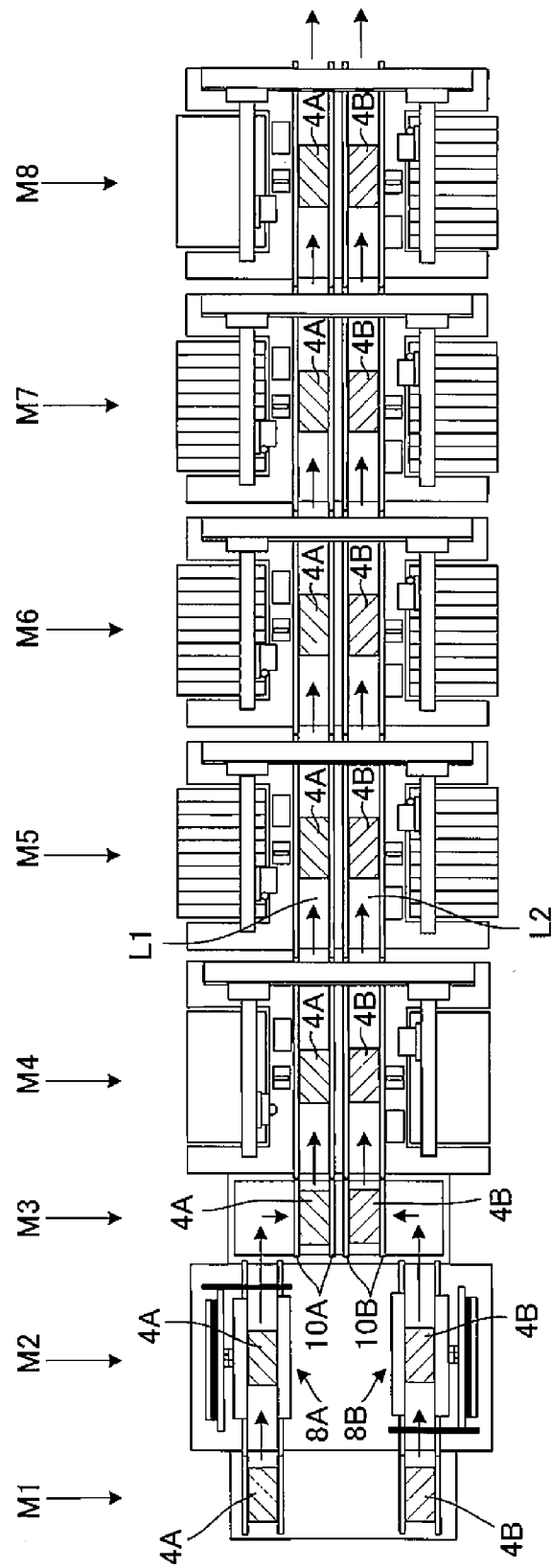
FIG. 12 is a view for explaining operation of the electronic component mounting system according to an embodiment of the invention.
Figure 13:
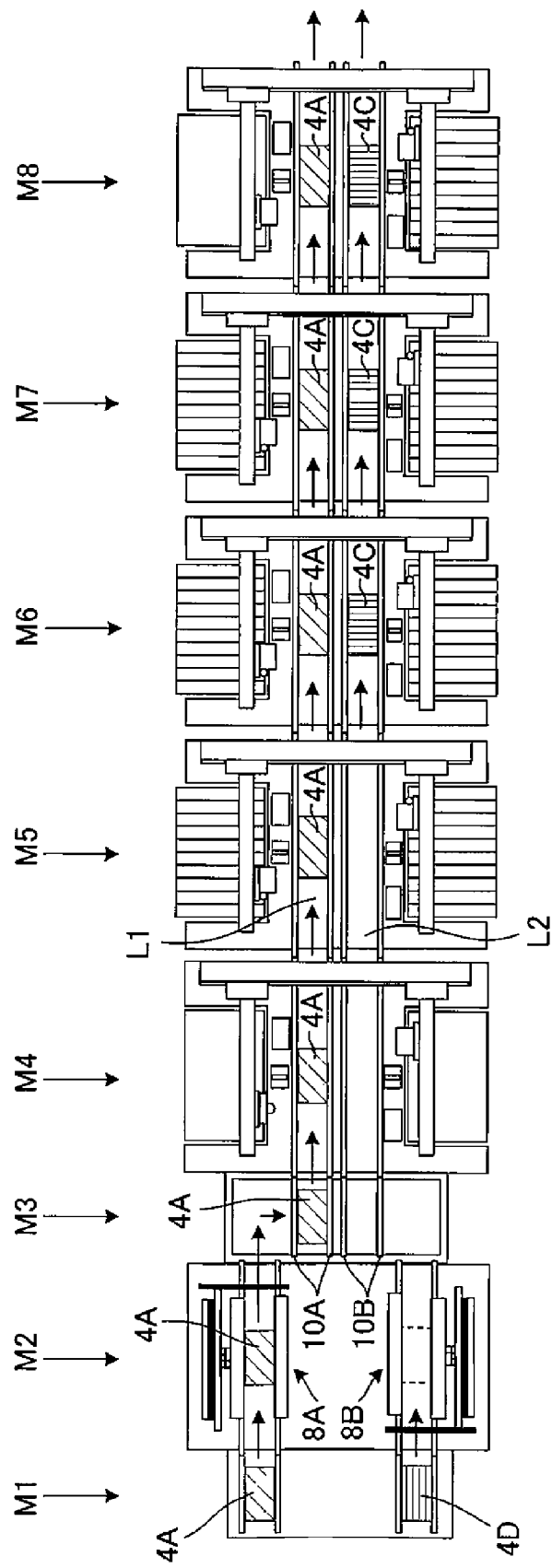
FIG. 13 is a view for explaining operation of the electronic component mounting system according to an embodiment of the invention.
Figure 14:
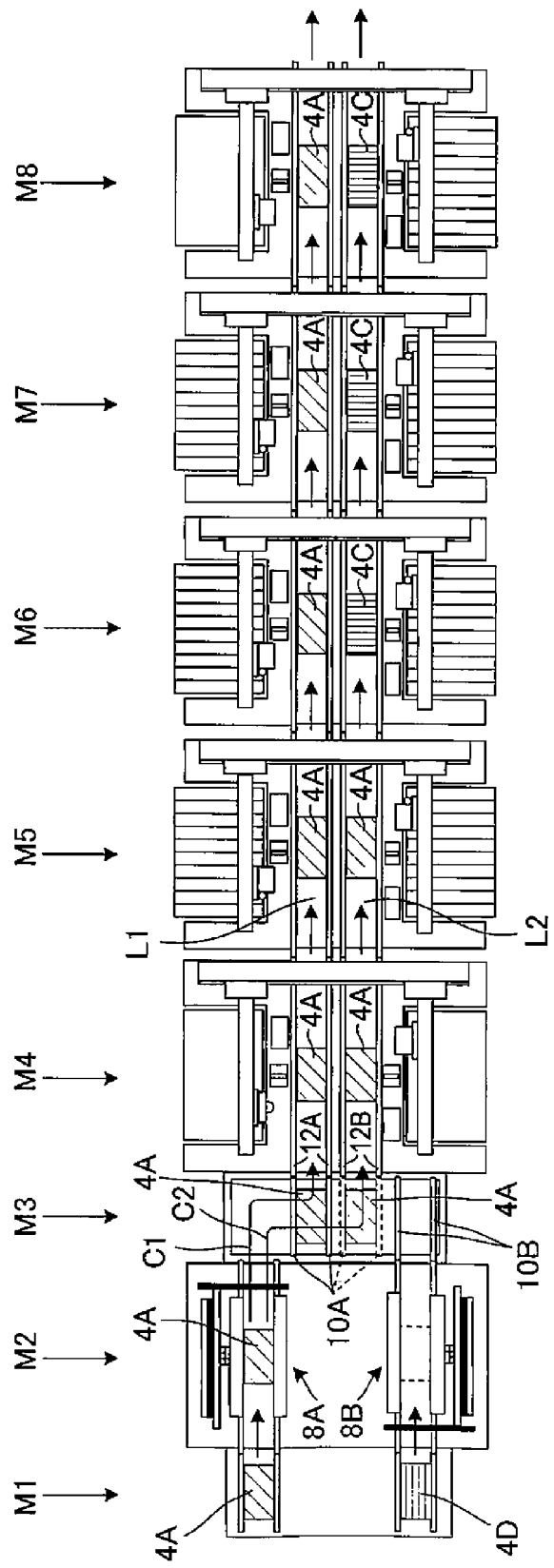
FIG. 14 is a view for explaining operation of the electronic component mounting system according to an embodiment of the invention.

An embodiment of the invention will be described below with reference to the drawings. FIG. 1 is a diagram for explaining the configuration of an electronic component mounting system according to an embodiment of the invention. FIG. 2 is a plan view showing part of the electronic component mounting system according to an embodiment of the invention. FIG. 3 is a plan view of a screen printing module in the electronic component mounting system according to an embodiment of the invention. FIGS. 4 and 5 are sectional views of the screen printing module in the electronic component mounting system according to an embodiment of the invention. FIG. 6 is a sectional view of an application/inspection module in the electronic component mounting system according to an embodiment of the invention. (a) to (c) of FIG. 7 are views for explaining operation of the application/inspection module in the electronic component mounting system according to an embodiment of the invention. FIG. 8 is a plan view showing part of the electronic component mounting system according to an embodiment of the invention. FIG. 9 is a sectional view of an electronic component mounting module in the electronic component mounting system according to an embodiment of the invention. FIG. 10 is a sectional view of a mounting/inspection module in the electronic component mounting system according to an embodiment of the invention. FIG. 11 is a block diagram showing the configuration of a control system for the electronic component mounting system according to an embodiment of the invention. FIGS. 12, 13 and 14 are views for explaining operation of the electronic component mounting system according to an embodiment of the invention.

The configuration of the electronic component mounting system will be described first with reference to FIG. 1. An electronic component mounting line 1 for forming this electronic component mounting system has a function of producing mounted boards on which electronic components are mounted. The electronic component mounting line 1 is configured so that respective modules, i.e. a board supply module M1, a screen printing module M2, a board distributing module M3, an application/inspection module M4, electronic component mounting modules M5, M6 and M7, a mounting/inspection module M8, a reflow module M9 and a board collecting module M10 are connected linearly in a board conveyance direction (X direction) in view from the upstream side (left side in FIG. 1). These respective modules are connected to a host computer 3 through an LAN system 2. The host computer 3 generally controls component mounting works executed by the respective modules in the electronic component mounting line 1.

Each board fed from the board supply module M1 located on the uppermost stream side is conveyed to the screen printing module M2. In the screen printing module M2, cream solder which is electronic component joint paste is printed on the board. Then, the board is delivered to the application/inspection module M4 by the board distributing module M3. In the application/inspection module M4, application of an electronic component bonding resin and inspection of the application are performed on the board. After inspection, electronic components are mounted on the board by the electronic component mounting modules M5, M6 and M7. Then, mounting of the electronic components and inspection after mounting are performed by the mounting/inspection module M8. After inspection, the board is conveyed into the reflow module M9. In the reflow module M9, the board after execution of component mounting operation is heated to heat the cream solder to thereby join the electronic components to the board by the solder. After the soldering, the board is collected by the board collecting module M10 and stored in the board collecting module M10.

In the aforementioned configuration, the screen printing module M2 forms a screen printing portion which prints electronic component joint paste on the board. The electronic component mounting modules M5, M6 and M7 form a component mounting portion which mounts electronic components on the board. The application/inspection module M4 forms an application/inspection portion which applies an electronic component bonding resin and inspects states before and after application. That is, the electronic component mounting line 1 is provided as an electronic component mounting system which is configured so that the screen printing portion for printing electronic component joint paste on the board and the application/inspection portion for applying an electronic component bonding resin and inspecting states before and after application are disposed on the upstream side of the component mounting portion for mounting electronic components on the board.

The respective modules, i.e. the board supply module M1 to the board collecting module M10 have two lanes of board conveyance mechanisms which can convey boards individually and respectively. Working mechanisms such as individual printing mechanisms for performing screen printing, component mounting mechanisms, etc. correspond to the board conveyance mechanisms in the respective modules. Accordingly, component mounting works can be executed on boards conveyed by the board conveyance mechanisms in the respective modules, simultaneously and concurrently by the corresponding working mechanisms.

A board conveyance lane formed by connection of the board conveyance mechanisms in the respective modules is combined with a corresponding individual printing mechanism and a corresponding component mounting mechanism to thereby form a mounting lane in which mounting work is executed on a board while the board is conveyed. In the electronic component mounting line 1 described in this embodiment, each module has two board conveyance mechanisms, so that two individual mounting lanes L1 and L2 are formed. That is, in the electronic component mounting line 1, a plurality of individual mounting lanes each formed by combining corresponding one of individual printing mechanisms, corresponding one of board conveyance mechanisms and corresponding one of component mounting mechanisms are operated so that component mounting works are executed on a plurality of boards simultaneously and concurrently.

Structures of the respective modules forming the electronic component mounting line 1 will be described below. The board supply module M1 to the application/inspection module M4 will be described first with reference to FIGS. 2 to 7. In FIG. 2, the board supply module M1 is formed so that first board supply conveyors 6A and second board supply conveyors 6B are disposed in a board supply direction above a first board supply mechanism 5A and a second board supply mechanism 5B in which boards 4 are stored respectively. The first board supply conveyors 6A and the second board supply conveyors 6B are connected to board conveyance conveyors 28 (see FIG. 3) of the screen printing module M2 adjacent on the downstream side. The boards 4 taken out from the first board supply mechanism 5A and the second board supply mechanism 5B are fed to the board conveyance conveyors 28 of the screen printing module M2 by the first board supply conveyors 6A and the second board supply conveyors 6B (arrows a).

The board distributing module M3 which is formed so that first board distributing conveyors 10A and second board distributing conveyors 10B are provided on an upper surface of a base 9 so as to be movable in a Y direction is provided adjacently on the downstream side of the screen printing module M2. After printing performed by the screen printing module M2, the boards 4 are delivered to the application/inspection module M4 through the board distributing module M3. Incidentally, the board distributing module M3 as a constituent member of the electronic component mounting line 1 may be provided as a single module as described here or may be provided as a board distributing portion belonging to the screen printing module M2.

The structure of the screen printing module M2 will be described next with reference to FIGS. 3, 4 and 5. FIG. 4 is a sectional view taken in the direction of arrows A-A in FIG. 3. FIG. 5 is a detailed sectional view for explaining the structure of each of a first individual printing mechanism 8A and a second individual printing mechanism 8B. The screen printing module M2 is formed so that the first individual printing mechanism 8A and the second individual printing mechanism 8B each of which has a function of printing soldering paste on a board and which are controlled individually to be able to perform printing operation independently are disposed symmetrically in parallel on a base 7. Each of the first individual printing mechanism 8A and the second individual printing mechanism 8B is provided with a board alignment portion 21 for positioning the board 4 in a print position and holding the board 4. A mask plate 32 provided with pattern holes and a squeegee moving mechanism 37 for sliding squeegees 36 (see FIG. 5) of a squeegee unit 33 on the mask plate 32 supplied with paste are disposed above each board alignment portion 21. The mask plate 32, the squeegee unit 33 and the squeegee moving mechanism 37 form a screen printing mechanism which prints paste on the board 4.

The detailed configuration of the board alignment portion 21, the squeegee unit 33 and the squeegee moving mechanism 37 will be described with reference to FIG. 5. In FIG. 5, the board alignment portion 21 is formed so that a Y-axis table 22, an X-axis table 23 and a θ-axis table 24 are stacked and a first Z-axis table 25 and a second Z-axis table 26 are further combined thereon. The configuration of the first Z-axis table 25 will be described. On the upper surface side of a horizontal base plate 24a provided on an upper surface of the θ-axis table 24, a base plate 25a likewise horizontal is held by an elevating guide mechanism (not shown) so as to be able to be moved up and down. The base plate 25a is moved up and down by a Z-axis elevating mechanism which is formed so that a plurality of feed screws 25c are driven to rotate by a board moving Z-axis motor 25b through a belt 25d. Two vertical frames 25e are disposed erectly on the base plate 25a. A pair of board conveyance conveyors 28 are held on upper end portions of the vertical frames 25e.

The board conveyance conveyors 28 are disposed in parallel to the board conveyance direction (X direction—direction perpendicular to the paper surface in FIG. 5). The board 4 as a print target is conveyed while opposite end portions of the board 4 are supported by the board conveyance conveyors 28. By driving the first Z-axis table 25, the board 4 held by the board conveyance conveyors 28 can be moved up and down together with the board conveyance conveyors 28 relative to the screen printing mechanism.

The configuration of the second Z-axis table 26 will be described. A horizontal base plate 26a is disposed between the board conveyance conveyors 28 and the base plate 25a so as to be able to move up and down along the elevating guide mechanism (not shown). The base plate 26a is moved up and down by a Z-axis elevating mechanism which is formed so that a plurality of feed screws 26c are driven to rotate by an under-setting portion elevating motor 26b through a belt 26d. A board under-setting portion 27 is detachably attached to an upper surface of the base plate 26a. The board under-setting portion 27 under-sets and holds the board 4 conveyed to a print position for the screen printing mechanism.

In printing operation performed by the first individual printing mechanism 8A and the second individual printing mechanism 8B, the board conveyance conveyors 28 receive boards 4 fed from the board supply module M1 through the first board supply conveyors 6A and the second board supply conveyors 6B respectively and convey the boards 4 to print positions for screen printing mechanisms to position the boards 4. After printing executed by the screen printing mechanisms, the boards 4 are conveyed out of the print positions by the board conveyance conveyors 28 and delivered to the first distributing conveyors 10A and the second distributing conveyors 10B of the board distributing module M3.

By driving the second Z-axis table 26, the board under-setting portion 27 is moved up and down relative to the board 4 held by the board conveyance conveyors 28. An under-setting surface of the board under-setting portion 27 abuts on a lower surface of the board 4 so that the board under-setting portion 27 supports the board 4 from the lower surface side. A clamp mechanism 29 is disposed on upper surfaces of the board conveyance conveyors 28. The clamp mechanism 29 has a pair of clamp members 29a disposed oppositely in the left and right. By moving one of the clamp members 29a by a driving mechanism 29b, the board 4 is clamped from opposite sides so as to be fixed.

The structure of the screen printing mechanism disposed above the board alignment portion 21 to print paste on the board conveyed to the print position will be described next. In FIGS. 3 and 5, a mask plate 32 is stretched over a mask frame 31 held by a mask holder (not shown), and pattern holes 32a are provided in the mask plate 32 so as to correspond to a print region in the board 4. The squeegee unit 33 is disposed above the mask plate 32 so as to be able to be moved by the squeegee moving mechanism 37.

The squeegee unit 33 is formed so that two squeegee elevating mechanisms 35 for moving up and down the pair of squeegees 36 disposed opposite to each other are disposed on a horizontal moving plate 34. The squeegee unit 33 is moved horizontally in the Y direction and a direction opposite to the Y direction by the squeegee moving mechanism 37 which is formed so that a feed screw 37b driven to rotate by a squeegee moving motor 37a is thread-engaged with a nut member 37c fixed to a lower surface of the moving plate 34. Incidentally, the mask plate 32, the moving plate 34, the squeegee moving mechanism 37, etc. in the first individual printing mechanism 8A of the first and second individual printing mechanisms 8A and 8B are not shown in FIG. 3.

As shown in FIG. 3, a head X-axis table 40X moved in the Y direction by a head Y-axis table 40Y is disposed above each board alignment portion 21. A camera head unit 38 and a mask cleaning unit 39 are attached to the head X-axis table 40X. The camera head unit 38 has a board recognition camera 38a for capturing an image of the board 4 from above, and a mask recognition camera 38b for capturing an image of the mask plate 32 from the lower surface side. The mask cleaning unit 39 has a cleaning head for cleaning the lower surface of the mask plate 32.

By driving the head X-axis table 40X and the head Y-axis table 40Y to move the camera head unit 38 and the mask cleaning unit 39 horizontally, recognition of the board 4 and recognition of the mask plate 32 can be performed simultaneously while the lower surface of the mask plate 32 can be cleaned in accordance with necessity. When these works are not performed, the camera head unit 38 and the mask cleaning unit 39 are located to be retracted from above to a side of the board alignment portion 21.

Printing operation performed by the first and second individual printing mechanisms 8A and 8B will be described next. First, each board 4 as a print target is conveyed to a print position by the board conveyance conveyors 28 and aligned with the board under-setting portion 27. Then, the second Z-axis table 26 is driven to move up the board under-setting portion 27, so that the board under-setting portion 27 under-sets the lower surface of the board 4. After the board alignment portion 21 is then driven to align the board 4 with the mask plate 32, the first Z-axis table 25 is driven to move up the board 4 together with the board conveyance conveyors 28 so that the board 4 abuts on the lower surface of the mask plate 32 provided with the pattern holes 32a.

Then, the board 4 is clamped by the clamp mechanism 29 to thereby fix the horizontal position of the board 4. In this state, one of the two squeegees 36 is moved down so as to abut on the mask plate 32. Then, the squeegee 36 is slid in a squeegeeing direction (Y direction) on the mask plate 32 supplied with paste such as cream solder to thereby print the paste on the board 4 through the pattern holes 32a. After completion of printing, the board 4 is moved down together with the board conveyance conveyors 28 so that the board 4 is separated from the lower surface of the mask plate 32. Further, after clamping by the clamp mechanism 29 is cancelled, the board 4 is conveyed to the downstream side by the board conveyance conveyors 28.

The conveyance of each board 4 to the downstream side after printing is performed through the board distributing module M3. On this occasion, the first board distributing conveyors 10A to which a printed board 4 is delivered from the first individual printing mechanism 8A can be moved in the Y direction to a position of alignment with the first board conveyance mechanism 12A of the application/inspection module M4 as shown in FIG. 3, so that the board 4 can be delivered to the first board conveyance mechanism 12A and conveyed along the first individual lane L1 shown in FIG. 1 (see the arrow C1). Moreover, the first board distributing conveyors 10A to which the printed board 4 is delivered from the board conveyance conveyors 28 of the first individual printing mechanism 8A can be moved in the Y direction to a position of alignment with the second board conveyance mechanism 12B of the application/inspection module M4 so that the board 4 can be delivered to the second board conveyance mechanism 12B and conveyed along the second individual mounting lane L2 shown in FIG. 1 (see the arrow C2). Similarly with respect to the board 4 printed by the second individual printing mechanism 8B, either of the first and second board conveyance mechanisms 12A and 12B can be selected as a destination of delivery.

That is, in the electronic component mounting line 1, a board distributing pattern in accordance with which the board distributing module M3 distributes the boards 4 to the first and second board conveyance mechanisms 12A and 12B after printing operation performed by the first and second individual printing mechanisms 8A and 8B can be selected arbitrarily. The boards 4 distributed to the first and second board conveyance mechanisms 12A and 12B are conveyed along the first and second individual mounting lanes L1 and L2 respectively, so that the boards 4 are conveyed into board conveyance mechanisms provided in the component mounting portion including the electronic component mounting module M5 and modules following the electronic component mounting module M5. Accordingly, the board distributing module M3 serves as a board distributing portion which can use any board distributing pattern so that printed boards conveyed out of the first and second individual printing mechanisms 8A and 8B as a plurality of individual printing mechanisms can be distributed to a plurality of board conveyance mechanisms provided in the component mounting portion.

When the board type is changed in the aforementioned printing operation, setup change work in each of the first and second individual printing mechanisms 8A and 8B such as mask exchange work for exchanging the mask plate 32 for a mask plate corresponding to the target board type, width adjustment work for adjusting the conveyance width of the board conveyance conveyors 28 to the width of the target board, etc. are performed in accordance with necessity. Because configuration is made so that boards 4 are fed to the first and second individual printing mechanisms 8A and 8B individually and respectively and the boards 4 can be conveyed out of the first and second individual printing mechanisms 8A and 8B individually after printing, printing operation can be performed on the boards 4 independently and the aforementioned setup change work in one of the first and second individual printing mechanisms 8A and 8B can be executed independently regardless of the operating state of the other individual printing mechanism. That is, the screen printing module M2 is formed to have a plurality of individual printing mechanisms (such as the first individual printing mechanism 8A and the second individual printing mechanism 8B) which are controlled individually so that printing operations can be performed independently and setup change works involved in change of the board type as a subject of printing can be executed individually.

The configuration of the application/inspection module M4 will be described with reference to FIGS. 2 and 6. FIG. 6 shows a B-B section in FIG. 2. The first board conveyance mechanism 12A and the second board conveyance mechanism 12B are disposed in the X direction in the center of an upper surface of a base 11. The first and second board conveyance mechanisms 12A and 12B convey the printed boards 4 conveyed out of the first and second individual printing mechanisms 8A and 8B of the screen printing module M2 and delivered through the board distributing module M3, position the boards 4 in work positions in the application/inspection module M4 and hold the boards 4.

A Y-axis moving table 13 is disposed in the Y direction at an X-direction downstream side end portion in the upper surface of the base 11. A first X-axis moving table 14A and a second X-axis moving table 14B are attached to the Y-axis moving table 13. As shown in FIG. 6, the X-axis moving tables 14A and 14B can be slid in the Y direction along guide rails 13a disposed on a side surface of the Y-axis moving table 13, so that the X-axis moving tables 14A and 14B are driven in the Y direction by a linear motor mechanism built in the Y-axis moving table 13. An application head 15 and an inspection head 16 are attached to the first X-axis moving table 14A and the second X-axis moving table 14B through X-axis moving attachment bases respectively. The application head 15 and the inspection head 16 are driven in the X direction by linear motor mechanisms built in the first X-axis moving table 14A and the second X-axis moving table 14B respectively. The Y-axis moving table 13, the first X-axis moving table 14A and the second X-axis moving table 14B form a head moving mechanism for moving the application head 15 and the inspection head 16.

The application head 15 is formed in such a manner that a dispenser 15b is held by a vertical base portion 15a so that the dispenser 15b can be moved up and down. The dispenser 15b has a function of discharging an electronic component joint resin adhesive agent from a nozzle 15c attached to a lower portion of the dispenser 15b. When the head moving mechanism moves the application head 15 above each of the boards 4 held by the first and second board conveyance mechanisms 12A and 12B, the resin adhesive agent can be applied on any resin application point on the board 4.

A waste application unit 17A used together with the application head 15 is disposed on a side of the first board conveyance mechanism 12A. When the application head 15 is moved above the waste application unit 17A so that the dispenser 15b is moved down to the waste application unit 17A, trial application for confirming the discharge state of the resin adhesive agent or waste application for removing the unnecessary resin adhesive agent deposited on the nozzle 15c is performed.

The inspection head 16 has a built-in image capturing device for capturing an image of the board 4 to be inspected. The head moving mechanism moves the inspection head 16 above each of the boards 4 held by the first and second board conveyance mechanisms 12A and 12B, so that the inspection head 16 captures an image of the board 4 to be inspected. A cart 18 attached to the base 11 from a side has a built-in recognition processing unit 18a. The image captured by the inspection head 16 is subjected to recognition processing by the recognition processing unit 18a, so that inspection based on image recognition about predetermined inspection items is performed. A calibration unit 17B is provided on a side of the second board conveyance mechanism 12B. When the inspection head 16 is moved above the calibration unit 17B to capture an image of the calibration unit 17B, the image-capturing state at the time of image acquisition by the inspection head 16 is calibrated.

Work operation in the application/inspection module M4 will be described next with reference to FIG. 7.

In (a) of FIG. 7, boards 4 are held by the first and second board conveyance mechanisms 12A and 12B respectively. Here, the board 4 held by the first board conveyance mechanism 12A is first a subject of inspection. The inspection head 16 moves above the board 4 and captures an image of an inspection target position of the board 4. Then, as shown in (b) of FIG. 7, after the inspection head 16 is retracted from above the board 4 as the subject of inspection, the application head 15 is moved above the board 4. Then, the dispenser 15*b* is moved down, so that the resin adhesive agent 19 is applied on an application point of the upper surface of the board 4 by the nozzle 15*c*.

Then, as shown in (c) of FIG. 7, after the application head 15 is retracted from above the board 4, the inspection head 16 is moved above the board 4 again so that an image of the board 4 on which the resin adhesive agent 19 is applied is captured. A result of the image capturing is subjected to recognition processing by the recognition processing unit 18*a*, so that pre-application inspection for inspecting the state of the board 4 before resin application and post-application inspection for the state of the same after resin application are performed. On this occasion, the application operation and the inspection processing can be completed without movement of the board 4 in the pre-application inspection, the application operation and the post-application inspection. Incidentally, the mode of inspection in the application/inspection module M4 is various. Besides the mode in which both pre-application inspection and post-application inspection are executed as shown in FIG. 7, the mode in which only one of pre-application inspection and post-application inspection is executed may be used.

Although the example shown in FIG. 7 is an example of application operation/inspection operation intended for only the board 4 held by the first board conveyance mechanism 12A, application operation/inspection operation may be intended for two boards 4 when the target boards 4 are held by the first and second board conveyance mechanisms 12A and 12B simultaneously. In this case, an operation pattern in accordance with which application operation/inspection operation can be performed most efficiently on the two boards 4 is used.

In the configuration of the application/inspection module M4, the first and second board conveyance mechanisms 12A and 12B serve as a plurality of board conveyance mechanisms which are provided in the board distributing module M3 as an application/inspection portion and which convey the respective printed boards 4 conveyed out of the individual printing mechanisms of the screen printing module M2. The Y-axis moving table 13, the first X-axis moving table 14A and the application head 15 form an application operation mechanism which executes resin application operation on the boards conveyed by the plurality of board conveyance mechanisms.

On the other hand, the Y-axis moving table 13, the second X-axis moving table 14B, the inspection head 16 and the recognition processing unit 18*a* form an inspection processing portion which executes pre-application inspection and/or post-application inspection on the board 4 before and/or after application operation on the board 4 by the application head 15. Thus, when the application operation mechanism and the inspection processing portion are combined with a plurality of board conveyance mechanisms to form the application/inspection module M4, two functions in the electronic component mounting line 1 having individual mounting lanes can be incorporated compactly in one module space.

The structures of the electronic component mounting module M5 to the mounting/inspection module M8 will be described next with reference to FIGS. 8, 9 and 10. FIGS. 9 and 10 show a C-C section and a D-D section in FIG. 8, respectively. Incidentally, because the electronic component mounting modules M5, M6 and M7 have the same structure, description will be made here in the condition that reference numerals and signs are given to only the electronic component mounting module M5. In FIGS. 8 and 9, a first board conveyance mechanism 42A and a second board conveyance mechanism 42B are disposed in the X direction in the center of an upper surface of a base 41. The first and second board conveyance mechanisms 42A and 42B convey boards 4 conveyed out of the first and second board conveyance mechanisms 12A and 12B of the application/inspection module M4 after application and inspection, position the boards 4 in work positions in the electronic component mounting modules M5, M6 and M7 and hold the boards 4.

Carts 49 to which a plurality of tape feeders 50 are attached are disposed on opposite sides of the base 41. Tape supply reels 49*a* wound with carrier tapes T holding electronic components to be mounted are attached to the carts 49 so as to correspond to the tape feeders 50. Each tape feeder 50 pitch-feeds the carrier tape T paid out from the tape supply reel 49*a* to thereby supply an electronic component to an extraction position for the component mounting mechanism which will be described below.

A Y-axis moving table 43 is disposed in the Y direction in an X-direction downstream side end portion in the upper surface of the base 41. A first X-axis moving table 44A and a second X-axis moving table 44B are attached to the Y-axis moving table 43. As shown in FIG. 9, the first and second X-axis moving tables 44A and 44B can be slid in the Y direction along guide rails 43*a* disposed on a side surface of the Y-axis moving table 43. The first and second X-axis moving tables 44A and 44B are driven in the Y direction by a linear motor mechanism built in the Y-axis moving table 43. First and second mounting heads 45A and 45B are attached to the first and second X-axis moving tables 44A and 44B through X-axis moving attachment bases, respectively. The first and second mounting heads 45A and 45B are driven in the X direction by linear motor mechanisms built in the first and second X-axis moving tables 44A and 44B, respectively. The Y-axis moving table 43, the first X-axis moving table 44A and the second X-axis moving table 44B form a head moving mechanism for moving the first and second mounting heads 45A and 45B.

Each of the first and second mounting heads 45A and 45B is formed so that adsorption nozzles 45*a* are detachably attached to the lower portion of the mounting head. The first and second mounting heads 45A and 45B are moved by the head moving mechanism and take electronic components out of the tape feeders 50 by the adsorption nozzles 45*a* so as to transfer and mount the electronic components onto the boards 4. The first mounting head 45A, the second mounting head 45B and the aforementioned head moving mechanism form a plurality of component mounting mechanisms (a first component mounting mechanism 46A and a second component mounting mechanism 46B) which execute component mounting work on the boards 4 conveyed by the first and second board conveyance mechanisms 42A and 42B.

A first component recognition camera 47A and a first nozzle storage portion 48A are disposed between the first board conveyance mechanism 42A and a corresponding tape feeder 50 while a second component recognition camera 47B and a second nozzle storage portion 48B are disposed between the second board conveyance mechanism 42B and a corresponding tape feeder 50. The first and second component recognition cameras 47A and 47B are located in moving paths of the first and second mounting heads 45A and 45B respectively so as to capture images of the electronic components held by the first and second mounting heads 45A and 45B from below. By recognition processing of the image capturing results, displacements of the electronic components held by the first and second mounting heads 45A and 45B respectively are detected.

The first and second nozzle storage portions 48A and 48B store and hold types of adsorption nozzles 45a to be attached to the first and second mounting heads 45A and 45B respectively in accordance with the types of the electronic components. When the first and second mounting heads 45A and 45B access the first and second nozzle storage portions 48A and 48B to execute nozzle exchange operation, the adsorption nozzles 45a attached to the first and second mounting heads 45A and 45B are exchanged in accordance with the types of the target electronic components.

That is, the component mounting portion including the electronic component mounting modules M5, M6 and M7 has a plurality of board conveyance mechanisms (the first board conveyance mechanism 12A and the second board conveyance mechanism 12B) which convey boards 4 distributed from the board distributing module M3 (the board distributing portion) and delivered from the application/inspection module M4, respectively, and a plurality of component mounting mechanisms (the first component mounting mechanism 46A and the second component mounting mechanism 46B) which execute component mounting work on the boards 4 conveyed by the board conveyance mechanisms.

The structure of the mounting/inspection module M8 will be described next with reference to FIG. 10. A first board conveyance mechanism 52A and a second board conveyance mechanism 52B are disposed in the X direction in the center of an upper surface of a base 51. The first and second board conveyance mechanisms 52A and 52B convey boards 4 conveyed out of the first and second board conveyance mechanisms 42A and 42B of the electronic component mounting module M7 after component mounting, position the boards 4 in work positions in the mounting/inspection module M8 and hold the boards 4. A cart 18 shown in FIG. 6 is disposed on one side of the base 51. A cart 49 shown in FIG. 9 is disposed on the other side of the base 51.

A Y-axis moving table 53 is disposed in the Y direction in an X-direction downstream side end portion in an upper surface of the base 51. A first X-axis moving table 54A and a second X-axis moving table 54B are attached to the Y-axis moving table 53. The first and second X-axis moving tables 54A and 54B can be slid in the Y direction along guide rails 53a disposed on a side surface of the Y-axis moving table 53. The first and second X-axis moving tables 54A and 54B are driven in the Y direction by a linear motor mechanism built in the Y-axis moving table 53. An inspection head 16 and a mounting head 55 are attached to the first and second X-axis moving tables 54A and 54B through X-axis moving attachment bases, respectively. The inspection head 16 and the mounting head 55 are driven in the X direction by linear motor mechanisms built in the first and second X-axis moving tables 54A and 54B, respectively. The Y-axis moving table 53, the first X-axis moving table 54A and the second X-axis moving table 54B form a head moving mechanism for moving the inspection head 16 and the mounting head 55.

The mounting head 55 is formed so that adsorption nozzles 55a are detachably attached to the lower portion of the mounting head 55. Similarly to the first mounting head 45A and the second mounting head 45B in the electronic component mounting modules M5, M6 and M7, the mounting head 55 is moved by the head moving mechanism so as to transfer and mount electronic components taken out of the tape feeder 50 onto the boards 4 conveyed by the first and second board conveyance mechanisms 52A and 52B. The mounting head 55 and the aforementioned head moving mechanism form a component mounting mechanism 56 which executes component mounting work on the boards 4 conveyed by the first and second board conveyance mechanisms 52A and 52B respectively. The inspection head 16 has the same function as that of the inspection head 16 in FIG. 6. The inspection head 16 captures images of the boards 4 conveyed by the first and second board conveyance mechanisms 52A and 52B after component mounting. When recognition processing is performed on the image capturing results by the recognition processing unit 18a, post-mounting inspection for determining whether the mounting state of the electronic component on each board 4 is good or not is performed.

In the configuration of the aforementioned electronic component mounting line 1, a conveyance lane formed by connecting the board conveyance conveyors 28 of the first individual printing mechanism 8A in the screen printing module M2, the first board conveyance mechanism 12A in the application/inspection module M4, the first board conveyance mechanisms 42A in the electronic component mounting module M5 to the mounting/inspection module M8 and the first board conveyance mechanism 52A in the mounting/inspection module M8 forms the first conveyance lane. By combining the first conveyance lane with the first individual printing mechanism 8A in the screen printing module M2 and the first component mounting mechanisms 46A in the electronic component mounting modules M5, M6 and M7, the first individual mounting lane L1 shown in FIG. 1 is formed.

Similarly, a conveyance lane formed by connecting the board conveyance conveyors 28 of the second individual printing mechanism 8B in the screen printing module M2, the second board conveyance mechanism 12B in the application/inspection module M4, the second board conveyance mechanisms 42B in the electronic component mounting modules M5, M6 and M7 and the second board conveyance mechanism 52B in the mounting/inspection module M8 forms the second conveyance lane. By combining the second conveyance lane with the second individual printing mechanism 8B in the screen printing module M2 and the second component mounting mechanisms 46B in the electronic component mounting modules M5, M6 and M7, the second individual mounting lane L2 shown in FIG. 1 is formed.

The configuration of a control system for the electronic component mounting line 1 will be described next with reference to FIG. 11. In FIG. 11, the host computer 3 has a mode instruction portion 60, a control portion 61, a communication portion 62, a storage portion 63, an operation/input portion 64, and a display portion 65. In multi-board mounting work in which the first and second individual mounting lanes L1 and L2 are operated to execute component mounting work on boards simultaneously and concurrently, the mode instruction portion 60 designates a work mode indicating a mode of component mounting work to be executed by each of the aforementioned individual mounting lanes. Here, the mode instruction portion 60 is designed so that either of a first work mode 66a and a second work mode 66b (which will be described below) is selectively designated in accordance with whether the board type is changed or not.

The control portion 61 generally controls work operation executed by the screen printing module M2, the board distributing module M3, the application/inspection module M4, the electronic component mounting modules M5, M6 and M7 and the mounting/inspection module M8. Here, the control portion 61 controls these respective modules in accordance with the work mode designated by the mode instruction portion 60.

The communication portion 62 performs signal exchange between the modules ranging from the board supply module M1 to the board collecting module M10 forming the electronic component mounting line 1, through the LAN system 2. The storage portion 63 stores not only data and programs necessary for execution of work operation on the target board type in the respective modules of the electronic component mounting line 1 but also information concerned with the aforementioned work mode. That is, the storage portion 63 includes a work mode storage portion 66. A first work mode 66*a* and a second work mode 66*b* are stored in the work mode storage portion 66.

The first work mode 66*a* is a mode in which component mounting work is performed continuously on a single board type without setup change work due to the board type change in each of the first individual mounting lane L1 and the second individual mounting lane L2. The second work mode 66*b* is a mode in which component mounting work is performed intermittently on a plurality of board types in one individual mounting lane while setup change work is executed repeatedly in the individual printing mechanism of the individual mounting lane whenever the plurality of board types are changed from one to another in the individual mounting lane. The second work mode includes the case where the board type is changed in only one of the first and second individual mounting lanes L1 and L2, and the case where the board type is changed in both the first and second individual mounting lanes L1 and L2.

The operation/input portion 64 is an input device such as a touch panel by which a line administrator administrating the electronic component mounting line 1 inputs various operation instructions. The operation instructions include the aforementioned work mode instructions. That is, the line administrator inputs a work mode instruction from the operation/input portion 64 so that the work mode is designated by the mode instruction portion 60. The display portion 65 is a display panel such as a liquid crystal panel which displays a guidance screen at the time of inputting an operation instruction, a setup change work instruction necessary at the time of changing the board type, etc.

Component mounting work executed by the electronic component mounting line 1 will be described next with reference to FIGS. 12, 13 and 14. The component mounting work described here means a multi-board mounting work in which the first and second individual mounting lanes L1 and L2 are operated, that is, working mechanisms such as component mounting mechanisms corresponding to board conveyance mechanisms belonging to the first and second individual mounting lanes L1 and L2 respectively are operated to execute component mounting work on boards 4 simultaneously and concurrently while the boards 4 are conveyed by the board conveyance mechanisms.

Multi-board mounting work executed according to the first work mode will be described first with reference to FIG. 12. Here is shown an example in which component mounting work is performed continuously on a single board type (board 4A or board 4B) in each of the first and second individual mounting lanes L1 and L2. That is, in the first individual mounting lane L1, the board 4A is first fed from the board supply module M1 to the first individual printing mechanism 8A of the screen printing module M2, so that printing work is executed on the board 4A by the first individual printing mechanism 8A. After printing, the board 4A is conveyed to the application/inspection module M4 through the board distributing module M3, so that application of a resin adhesive agent and inspection are executed by the application/inspection module M4.

Then, the board 4A is conveyed into the electronic component mounting module M5, so that component mounting work is executed on the board 4A by the first component mounting mechanism 46A in the electronic component mounting module M5. Moreover, component mounting work is also executed on the board 4A in the same manner by the electronic component mounting modules M6 and M7 in the course of conveying the board 4A to the downstream side successively. After component mounting work performed by the component mounting mechanism 56 and post-mounting inspection performed by the inspection head 16 are then executed on the board 4A conveyed to the mounting/inspection module M8, the board 4A is conveyed to the reflow module M9 so that soldering is performed on the board 4A by the reflow module M9.

Also in the second individual mounting lane L2, component mounting work is continuously executed on the board 4B in the same manner as in the aforementioned example. The first work mode can achieve high production efficiency because component mounting work is executed continuously on the single board type without setup change work. Accordingly, the first work mode is suitable for the production form which requires mass production. Although the example described here is an example in which different board types (board 4A and board 4B) are the targets in the first and second individual mounting lanes L1 and L2 respectively, one and the same board type (e.g. board 4A) may be put into both the first and second individual mounting lanes L1 and L2 when a higher production quantity is required for one board type.

Multi-board mounting work executed according to the second work mode will be described next with reference to FIG. 13. The second work mode is a mode in which component mounting work is intermittently executed on a plurality of board types while setup change work is executed repeatedly whenever the board type is changed in either or both of the first and second individual mounting lanes L1 and L2. Here is shown an example in which component mounting work is continuously executed on a signal board type in the first individual mounting lane L1, but component mounting work is intermittently executed on a plurality of board types while setup change work is executed repeatedly in the individual printing mechanism of the second individual mounting lane L2 whenever the board type is changed in the individual mounting lane.

That is, in the first individual mounting lane L1, component mounting work is continuously executed on one board type board 4A in the same manner as in the first work mode shown in FIG. 12. On the other hand, in the second individual mounting lane L2, component mounting work is executed on a scheduled production quantity (three in this example) of one-board-type boards 4C and then the board type is changed to another-board-type board 4D. That is, in the second work mode shown in FIG. 13, component mounting work for a plurality of board types in one individual mounting lane (the second individual mounting lane L2 in this example) and component mounting work for a single board type in the other individual mounting lane (the first individual mounting lane L1 in this example) are executed simultaneously and concurrently. The second work mode is suitable for the case where a higher production quantity is required for one board type (board 4A in this example) than for another board type in the production form in which component mounting work is executed on a plurality of board types.

However, in this case, board conveyance from the second individual printing mechanism 8B after printing is stopped while setup change work such as mask plate exchange due to the board type change is executed on the second individual printing mechanism 8B in the screen printing module M2. As a result, as shown in FIG. 13, a "board waiting state" in which there is no work target board in some modules in the second individual mounting lane L2 is generated. When such a "board waiting state" is generated frequently, the total actual operating rate of the mounting line is lowered to spoil productivity of equipment. It is therefore desirable that lowering in actual operating rate is prevented as much as possible.

In such a case, a method as shown in FIG. 14 can be used for component mounting work according to the aforementioned second work mode. Here, when the board 4A printed by the first individual printing mechanism 8A is delivered to the application/inspection module M4, the board 4A is delivered not only to the first individual mounting lane L1 but also to the second individual mounting lane L2 while setup change work is executed on the second individual printing mechanism 8B in the screen printing module M2. That is, the board 4A is delivered not only to the first board conveyance mechanism 12A but also to the second board conveyance mechanism 12B by the board distributing function (see FIG. 3) of the board distributing module M3 (see the arrows C1 and C2). In this manner, the printed board 4A is fed also to the second individual mounting lane L2 and conveyed to a board conveyance mechanism which belongs to the second individual mounting lane L2 and in which a "board waiting state" is generated in the electronic component mounting modules M5, M6 and M7 (the board conveyance mechanism of the electronic component mounting module M5 in this example), so that component mounting work is executed on the board 4A by a corresponding component mounting mechanism.

That is, in the example shown in FIG. 14, in the second work mode, the board printed by an individual printing mechanism (the first individual printing mechanism 8A) belonging to the other individual mounting lane (the first individual mounting lane L1) is conveyed into a board conveyance mechanism belonging to one individual mounting lane (the second individual mounting lane L2) in the component mounting portion (the electronic component mounting modules M5, M6 and M7) by the board distributing portion (the board distributing module M3) during execution of setup change work in an individual printing mechanism (the second individual printing mechanism 8B) belonging to the individual mounting lane so that component mounting work is executed on the board in the individual mounting lane.

In this manner, generation of the board waiting state due to the board type change can be avoided as much as possible, so that lowering in actual operating rate can be prevented. Incidentally, this example is premised on the fact that the tact time of printing work performed by the first individual printing mechanism 8A is shorter than the tact time of component mounting work performed by the component mounting mechanisms of the electronic component mounting modules M5, M6 and M7 on the downstream side, and that the first individual printing mechanism 8A has throughput capacity to spare.

As described above, according to the invention, provided is an electronic component mounting system which is formed so that a screen printing portion having a plurality of individual printing mechanisms is connected to an upstream side of a component mounting portion having a plurality of board conveyance mechanisms and which is configured so that either of a first work mode in which component mounting work is continuously executed on a fixed board type in all individual mounting lanes and a second work mode in which component mounting work is intermittently executed in one individual mounting lane while setup change work is repeated in corresponding one of the individual printing mechanisms whenever board types are changed from one to another in the individual mounting lane is selectively designated in multi-board mounting work in which the individual mounting lanes are operated to execute component mounting work on a plurality of boards simultaneously and concurrently. In this manner, both mass production of one and the same items and small volume production of many items can be used suitably selectively by one electronic component mounting line, so that high productivity and responsiveness to production of many items can be achieved consistently.

Although the invention has been described in detail and with reference to a specific embodiment, it is obvious to those skilled in the art that various changes and modifications can be made without departing from the spirit and scope of the invention.

This application is based on Japanese Patent Application (Patent Application 2008-258139) filed on Oct. 3, 2008 and the contents thereof are incorporated herein by reference.

INDUSTRIAL APPLICABILITY

The electronic component mounting system and the electronic component mounting method according to the invention have an effect that component mounting work can be executed on a plurality of boards simultaneously, concurrently and efficiently, and are useful in the electronic component mounting field for mounting electronic components on boards to produce mounted boards.

DESCRIPTION OF THE REFERENCE NUMERALS AND SIGNS 1 electronic component mounting line
4, 4A, 4B, 4C, 4D board
8A first individual printing mechanism
8B second individual printing mechanism
10A first board distributing conveyor
10B second board distributing conveyor
12A first board conveyance mechanism
12B second board conveyance mechanism
15 application head
16 inspection head
46A first component mounting mechanism
46B second component mounting mechanism
M1 board supply module
M2 screen printing module
M3 board distributing module
M4 application/inspection module
M5, M6, M7 electronic component mounting module
M8 mounting/inspection module
M9 reflow module
M10 board collecting module

The invention claimed is:

1. An electronic component mounting system formed so that a screen printing portion for printing electronic component joint paste on boards is disposed on an upstream side of a component mounting portion for mounting electronic components on the boards, the electronic component mounting system comprising:
  individual printing mechanisms which are provided in the screen printing portion and controlled individually so that printing operations can be performed independently and setup change works due to change in print target board type can be executed individually;
  board conveyance mechanisms which are provided in the component mounting portion to convey the boards printed and conveyed out of the individual printing mechanisms respectively, and component mounting mechanisms which are provided in the component mounting portion to execute component mounting works on the boards conveyed by the board conveyance mechanisms respectively;

a mode instruction portion which designates a work mode indicating a mode of component mounting work to be executed by each of individual mounting lanes in multi-board mounting work in which the individual mounting lanes each composed of a combination of corresponding one of the individual printing mechanisms, corresponding one of the board conveyance mechanisms and corresponding one of the component mounting mechanisms are operated to execute component mounting work on boards simultaneously and concurrently; and a control portion which controls the screen printing portion and the component mounting portion in accordance with the designated work mode; characterized in that:

the mode instruction portion selectively designates either of a first work mode in which component mounting work is continuously executed on a single board type in each individual mounting lane, and a second work mode in which component mounting work is intermittently executed on a plurality of board types in one individual mounting lane while the setup change work is executed repeatedly in the individual printing mechanism of the individual mounting lane whenever the board types are changed from one to another in the individual mounting lane.

2. The electronic component mounting system according to claim 1, wherein component mounting work on the plurality of board types in the individual mounting lane and component mounting work on the single board type in another individual mounting lane are performed simultaneously and concurrently in the second work mode.

3. An electronic component mounting method performed by an electronic component mounting system formed so that a screen printing portion for printing electronic component joint paste on boards is disposed on an upstream side of a component mounting portion for mounting electronic components on the boards, the electronic component mounting system including:

individual printing mechanisms which are provided in the screen printing portion and controlled individually so that printing operations can be performed independently and setup change works due to change in print target board type can be executed individually;

board conveyance mechanisms which are provided in the component mounting portion to convey the boards printed and conveyed out of the individual printing mechanisms respectively, and component mounting mechanisms which are provided in the component mounting portion to execute component mounting works on the boards conveyed by the board conveyance mechanisms respectively;

a mode instruction portion which designates a work mode indicating a mode of component mounting work to be executed by each of individual mounting lanes in multi-board mounting work in which the individual mounting lanes each composed of a combination of corresponding one of the individual printing mechanisms, corresponding one of the board conveyance mechanisms and corresponding one of the component mounting mechanisms are operated to execute component mounting work on boards simultaneously and concurrently; and a control portion which controls the screen printing portion and the component mounting portion in accordance with the designated work mode;

wherein the mode instruction portion selectively designates either of a first work mode in which component mounting work is continuously executed on a single board type in each individual mounting lane, and a second work mode in which component mounting work is intermittently executed on a plurality of board types in one individual mounting lane while the setup change work is executed repeatedly in the individual printing mechanism of the individual mounting lane whenever the board types are changed from to another in the individual mounting lane.

4. The electronic component mounting method according to claim 3, wherein component mounting work on the plurality of board types in the individual mounting lane and component mounting work on the single board type in another individual mounting lane are performed simultaneously and concurrently in the second work mode.

* * * * *